(12) United States Patent
Lee et al.

(10) Patent No.: US 7,081,380 B2
(45) Date of Patent: Jul. 25, 2006

(54) METHOD OF FORMING A CONDUCTIVE PATTERN OF A SEMICONDUCTOR DEVICE AND METHOD OF MANUFACTURING A NON-VOLATILE SEMICONDUCTOR MEMORY DEVICE USING THE SAME

(75) Inventors: Don-Woo Lee, Suwon-si (KR); Chul-Soon Kwon, Seoul (KR); Chang-Yup Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 10/782,782

(22) Filed: Feb. 23, 2004

(65) Prior Publication Data
US 2004/0171243 A1    Sep. 2, 2004

(30) Foreign Application Priority Data
Feb. 27, 2003    (KR) ...................... 10-2003-0012429

(51) Int. Cl.
*H01L 21/8238*    (2006.01)
(52) U.S. Cl. ................. 438/201; 438/692; 257/E21.23; 257/E21.663
(58) Field of Classification Search ................ 438/201, 438/211, 257
See application file for complete search history.

(56) References Cited

U.S. PATENT DOCUMENTS

| | | | | |
|---|---|---|---|---|
| 4,964,946 A | * | 10/1990 | Gray et al. | .................... 216/13 |
| 6,181,060 B1 | * | 1/2001 | Rolfson | ...................... 313/495 |
| 6,706,592 B1 | * | 3/2004 | Chern et al. | ................ 438/257 |

FOREIGN PATENT DOCUMENTS

JP    2001-23981    1/2001

OTHER PUBLICATIONS

Wolf, Silicon processing for the VLSI Era, vol. 2, p. 238 (1990), Lattice Press, CA.*

* cited by examiner

*Primary Examiner*—Asok Kumar Sarkar
(74) *Attorney, Agent, or Firm*—Volentine Francos & Whitt

(57) ABSTRACT

A method of forming a conductive pattern of a semiconductor device includes forming a conductive layer is on a substrate, forming a polishing protection layer on the substrate including over the conductive layer, and forming a step compensation layer on the polishing protection layer to reduce the step presented by the layer that is the polishing protection layer. The conductive layer is the exposed by removing select portions of the step compensation layer and the polishing protection layer. The conductive pattern is ultimately formed on the substrate by etching the exposed conductive layer. By planarization the intermediate structure several times once the step compensation layer is formed, a highly uniform conductive layer is sure to be formed.

20 Claims, 13 Drawing Sheets

METHOD OF FORMING A CONDUCTIVE PATTERN OF A SEMICONDUCTOR DEVICE AND METHOD OF MANUFACTURING A NON-VOLATILE SEMICONDUCTOR MEMORY DEVICE USING THE SAME

BACKGROUND OF THE INVENTION

1. Field of the Invention

The present invention relates to a method of forming a conductive pattern of a semiconductor device, and to a method of manufacturing a non-volatile semiconductor memory device using the conductive pattern.

2. Description of the Related Art

Semiconductor memory devices are generally divided into volatile semiconductor memory devices and non-volatile semiconductor memory devices. In the volatile semiconductor memory device, data stored in the cell is dissipated when power is not applied to the device. However, in the non-volatile semiconductor memory device, stored data in the cell is retained even when power is not applied. Because non-volatile semiconductor memory devices can store data for long periods of time, they are used to meet the current high demand for flash semiconductor memory devices such as EEPROMs (electrically erasable and programmable read only memories).

Meanwhile, flash semiconductor memory devices can be generally categorized as stacked flash semiconductor memory devices and split gate flash semiconductor memory devices. The split gate type of flash semiconductor memory device has a structure wherein a floating gate and a control gate are separated from each other, and the floating gate is electrically insulated from the outside. Information is stored in a memory cell of the split gate type of flash semiconductor memory device using the principle that current in a memory cell changes depending on electron injection (programming)/electron discharge (erasing) into/from the floating gate. In the electron injection, hot electrons are injected into the floating gate by a channel hot electron injection (CHEI) mechanism. The electron discharge is accomplished by Fowler-Nordheim (F-N) tunneling through a tunnel insulation layer between the floating gate and the control gate of the split gate type of flash semiconductor memory device. In connection with the electron injection (programming) and electron discharge (erasing), a voltage distribution may be explained as an equivalent capacitor model. Recently, the split gate type of flash semiconductor memory device has been widely used for the purpose of storing data.

FIGS. 1A to 1F illustrate a conventional method of manufacturing a non-volatile semiconductor memory device and, in particular, a split gate type of flash semiconductor device. In the method shown in FIGS. 1A to 1F, the split gate type of flash semiconductor device is not manufactured using a photolithographic process, but by a self-align process.

Figure 1A:
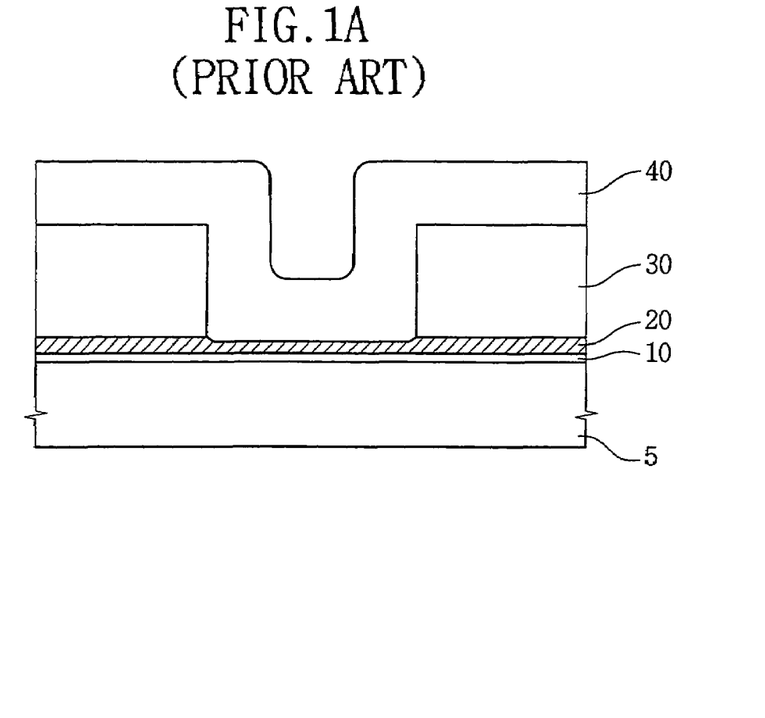
FIGS. 1A to 1F are cross-sectional views of a substrate illustrating a conventional method of manufacturing a non-volatile semiconductor memory device.

Referring to FIG. 1A, a first oxide layer 10 and a first conductive layer 20 are formed sequentially on a semiconductor substrate 5, and then a first nitride layer 30 is formed on the first conductive layer 20. The first nitride layer 30 will be patterned to form a floating gate of the flash semiconductor memory device.

The first conductive layer 20 is exposed by partially etching the first nitride layer 30 using a photolithographic process. Then, a second oxide layer 40 is formed on the exposed first conductive layer 20 and the first nitride layer 30.

Figure 1B:
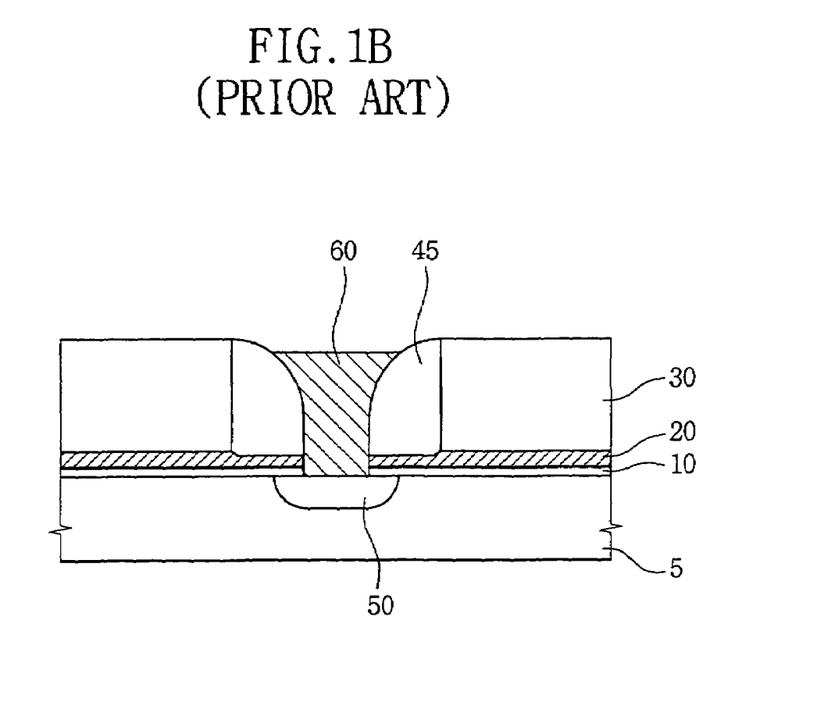

Referring to FIG. 1B, a spacer 45 is formed on a sidewall of the first nitride layer 30 by etching the second oxide layer 40 using an etch-back process. A portion of the semiconductor substrate 5 is exposed by partially etching the first conductive layer 20 and the first oxide layer 10 using the spacer 45 as an etching mask. Next, impurities are implanted into the exposed portion of the semiconductor substrate 5 to form a source region 50.

Figure 1C:
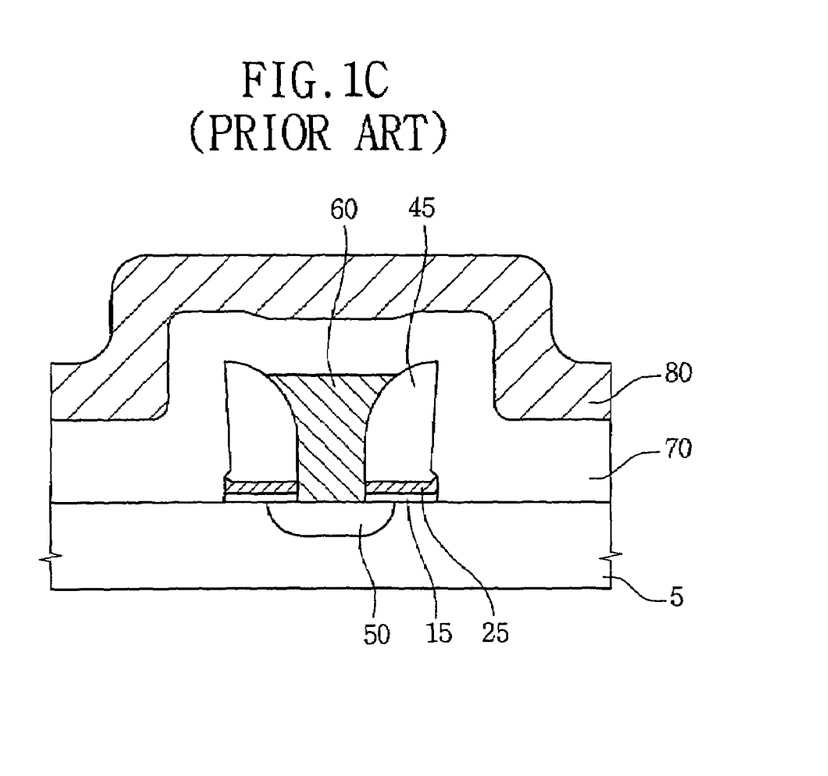

Referring to FIG. 1C, the first nitride layer 30 is removed using phosphoric acid to expose the first conductive layer 20 and the first oxide layer 10 beneath the first nitride layer 30. An oxide pattern 15 and a floating gate 25 are formed by removing the exposed portions of the first conductive layer 20 and the first oxide layer 10. Next, a third oxide layer (not shown) is formed of. Then, a second conductive layer 70 that are for is formed on the third oxide layer. In this case, the third oxide layer (not shown) serves as insulation for the second conductive layer 70 and the floating gate 25. A second nitride layer 80 is formed on the second conductive layer 70.

Figure 1D:
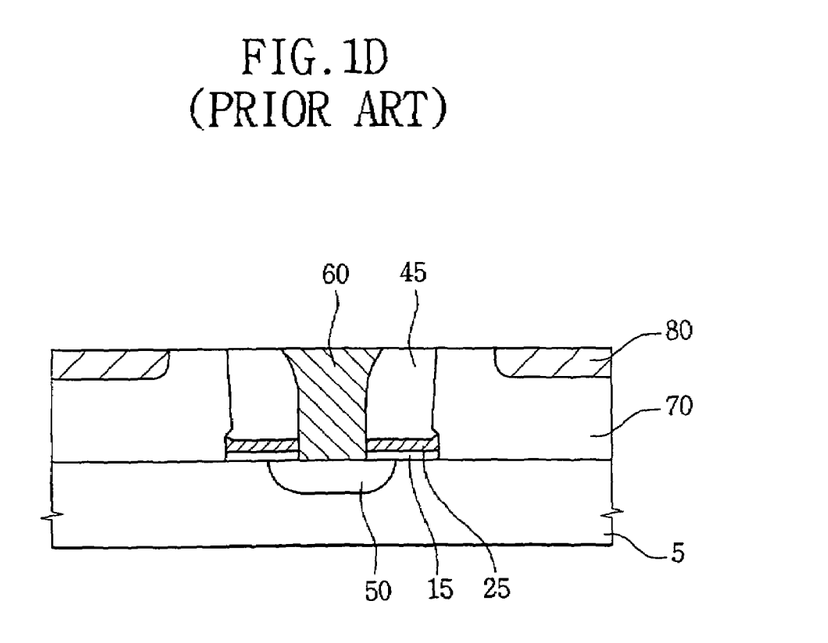

Referring to FIG. 1D, the structure is planarized using a CMP (Chemical Mechanical Polishing) process until the source line 60 contacting the source region 50 is exposed. As a result, the second nitride layer 80 remains on a portion of the second conductive layer 70 disposed adjacent spacer 45. Therefore, upper surfaces of the second conductive layer 70 and the source line 60 that are disposed between the spacer 45 and the remaining portion of the second nitride layer 80 are exposed.

Figure 1E:
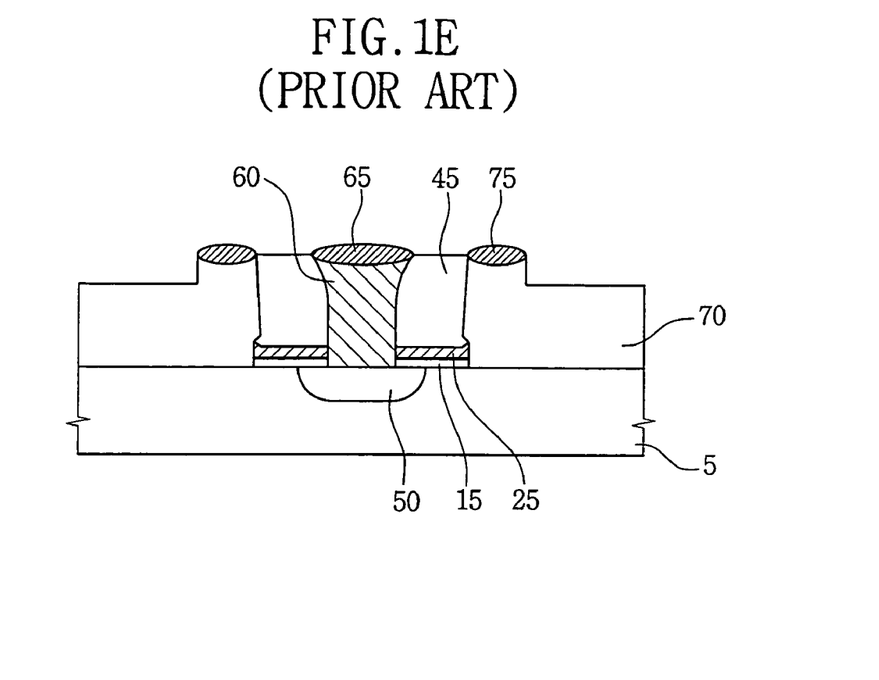

Referring to FIG. 1E, fourth oxide layers 65 and 75 are formed on the second conductive layer 70 and the source line 60 by oxidizing the exposed second conductive layer 70 and the source line 60. Then, the second nitride layer 80 remaining on the second conductive layer 70 is removed by a wet etching process.

Figure 1F:
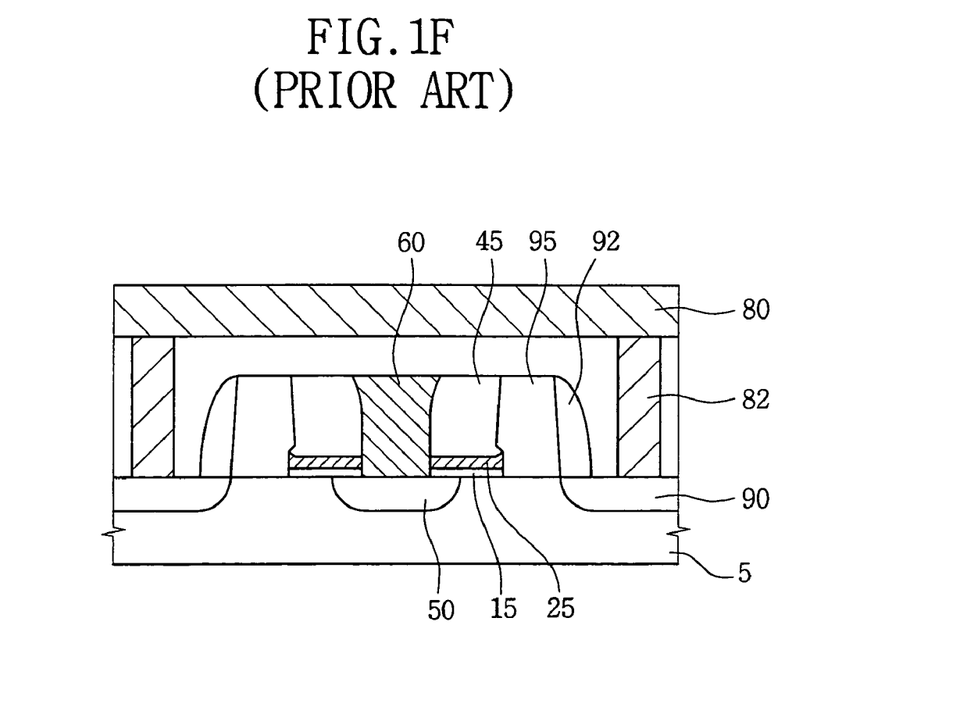

Referring to FIG. 1F, a control gate 95 is formed adjacent the floating gate 25 by patterning the second conductive layer 70 using the fourth oxide layers 65 and 75 as etching masks. Here, most of the fourth oxide layers 65 and 75 used as the masks is removed. Then the remaining portions of the fourth oxide layers 65 and 75 are removed by a subsequent cleaning process and a silicidation pretreatment process.

Next, a nitride spacer 92 is formed on a sidewall of the control gate 95. Then, a drain region 90 is formed in the substrate 50 adjacent the control gate 95. A silicidation process and a metallization process are then carried out to form metal wiring 80 above the resultant structure, and a drain contact 82 contacting the drain region 90 is formed to complete the split gate type of flash semiconductor memory device.

However, according to the above-described method, as shown in FIGS. 1C and 1D, due to the CMP process applied used to planarize the second conductive layer 70 is applied to a protruding portion of the second nitride layer 80 (that is, a step). Accordingly, it is difficult to uniformly polish the structure. Therefore, the control gate of the flash semiconductor memory device may not have a uniform upper portion, thereby detracting from the cell efficiency of the semiconductor device.

Japanese Laid-Open Patent Publication No. 2001-023981 discloses a CMP process for forming a uniform film of wiring patterns having different densities on a semiconductor substrate. In the process disclosed in the above-mentioned Japanese Laid-Open Patent Publication, an insulation layer and a photoresist layer are formed on the semiconductor substrate having the wiring patterns, and then the photoresist layer is etched back to form a photoresist pattern on a concave portion of the insulation layer. After the insulation layer is etched using the photoresist pattern as an etching mask, the photoresist pattern is removed. Then, a CMP process is performed on the insulation layer to form a uniform film. However, the control gate or a word line would not have a stable structure because of a difference in the amounts of polishing of a conductive layer due to a polishing protection layer formed on the conductive pattern.

SUMMARY OF THE PRESENT INVENTION

A feature of the present invention is to provide a method of forming a conductive pattern having a high degree of uniformity.

Likewise, a feature of the present invention is to provide a method of manufacturing a non-volatile semiconductor memory device having excellent characteristics and a high degree of reliability.

In accordance with one aspect of the present invention, a conductive layer is formed on a semiconductor substrate, a polishing protection layer is formed on the semiconductor substrate including over the conductive layer, and a step compensation layer is formed on the polishing protection layer to reduce a step presented by the polishing protection layer as the result of its having been formed over the conductive layer. The conductive layer is then exposed by removing respective portions of the step compensation layer and the polishing protection layer. Then, a conductive pattern is formed on the semiconductor substrate by etching away part of the exposed conductive layer.

In accordance with another aspect of the present invention, a structure including a floating gate is formed on a semiconductor substrate. A conductive layer is formed on the semiconductor substrate including over the structure. A polishing protection layer is formed on the conductive layer, and then a step compensation layer is formed on the polishing protection layer to reduce the step presented by the polishing protection layer as the result of its having been formed on the structure made up of the floating gate. The conductive layer is exposed by removing portions of the step compensation layer and the polishing protection layer. A conductive pattern is formed adjacent the structure by etching away part of the conductive layer. Next, an oxide layer is formed on the conductive pattern. Finally, a control gate is formed adjacent the floating gate by etching the conductive pattern using the oxide layer as an etching mask.

According to the present invention, the removal of material to form the conductive pattern is carried out using several planarization processes, once the step compensation layer is formed to reduce the step presented by the polishing protection layer. As a result, the uniformity of a structure of the semiconductor device including, for example, that of the conductive layer can be critically enhanced. Thus, the characteristics and reliability of the semiconductor device can be improved.

BRIEF DESCRIPTION OF THE DRAWINGS

These and other objects, features and advantages of the present invention will become more readily apparent from the following detailed description thereof made in conjunction with the accompanying drawings.

DETAILED DESCRIPTION OF THE PREFERRED EMBODIMENTS

The present invention now will be described more fully hereinafter with reference to the accompanying drawings. Note, like reference numbers designate like elements throughout the drawings. Also, the relative thickness of layers may be exaggerated in the drawings for clarity in illustrating the present invention.

Figure 2:
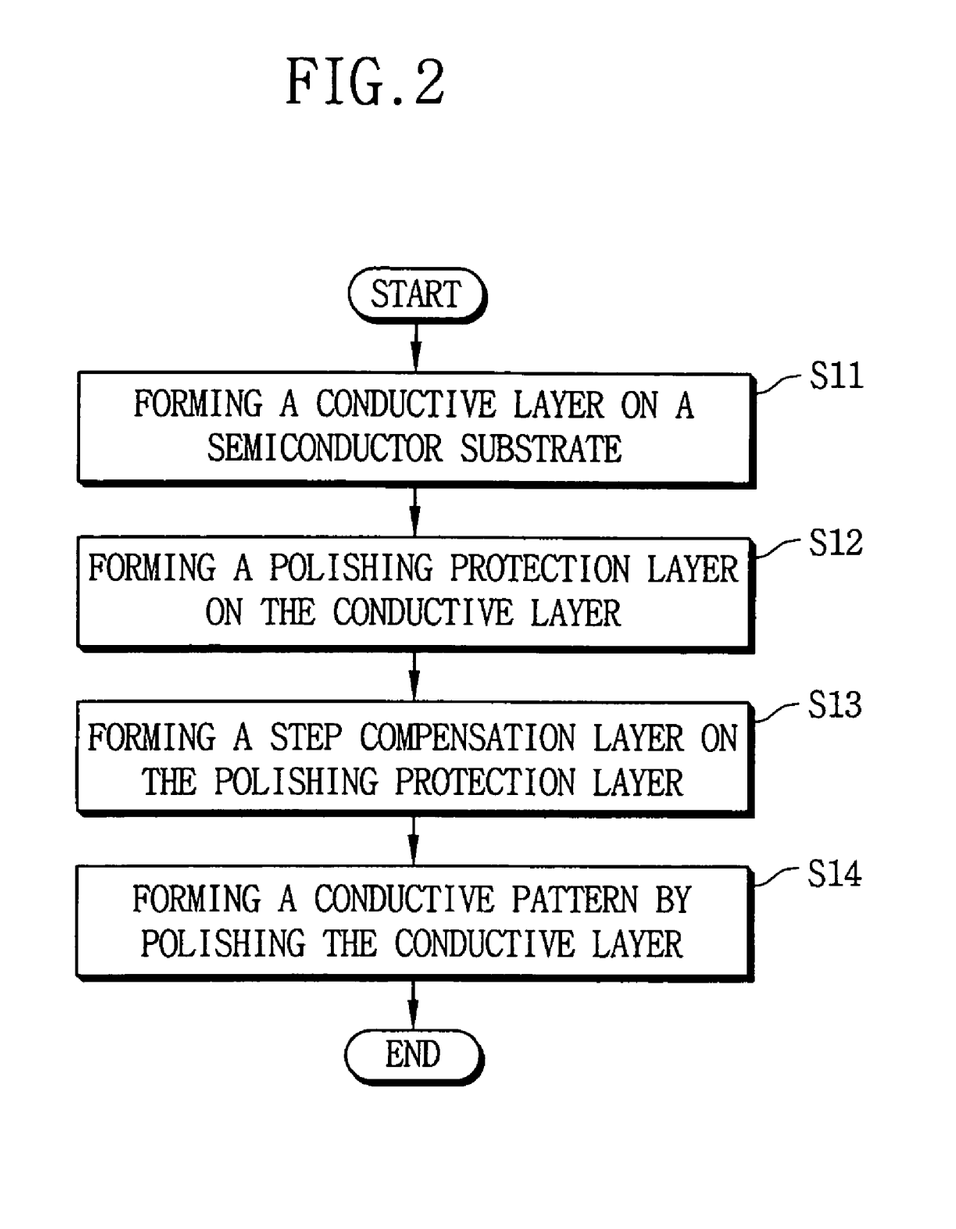
FIG. 2 is a flowchart illustrating a method of forming a conductive pattern of a semiconductor device according to the present invention.

Referring now to FIG. 2, a conductive layer is formed on a semiconductor substrate (step S11). Then, a polishing protection layer is formed on the conductive layer (step S12). The polishing protection layer has a step due to a height difference between the semiconductor substrate and the conductive layer formed on the semiconductor substrate.

A step compensation layer is formed on the polishing protection layer (step S13) to reduce the step so that the subsequent CMP process can produce excellent uniformity in the resultant structure.

Finally, a conductive pattern having good uniformity is formed on the semiconductor substrate by polishing the step compensation layer, the polishing protection layer and the conductive layer (step S14). In particular, the conductive pattern is formed by a primary planarization process and a secondary planarization process.

Hereinafter, the method of forming the conductive pattern according to the present invention will be described in more detail with reference to FIGS. 3A to 3E.

Figure 3A:
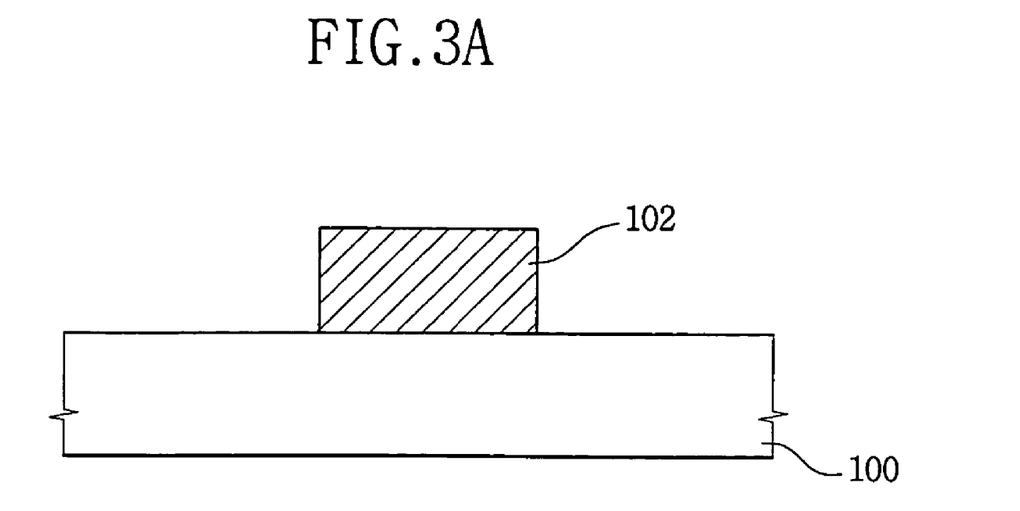
FIGS. 3A to 3E are cross-sectional views of a substrate illustrating the method of forming the conductive pattern of the semiconductor device according to the present invention.

Referring first to FIG. 3A, a conductive layer 102 is formed on a semiconductor substrate 100. The conductive layer 102 includes polysilicon, doped polysilicon or a metal such as copper, tungsten, aluminum or titanium. Alternatively, an insulation layer including an oxide film or a nitride film may be formed on the substrate 100 before the conductive layer 102 is formed on the substrate 100.

The conductive layer 102 may constitute an underlying structure such as an electrode, a contact plug, a bit line, or a word line. The conductive layer 102 is formed using a chemical vapor deposition (CVD) process, a physical vapor deposition (PVD) process or a sputtering process selected based on the material from which the conductive layer 102 is to be formed.

Figure 3B:
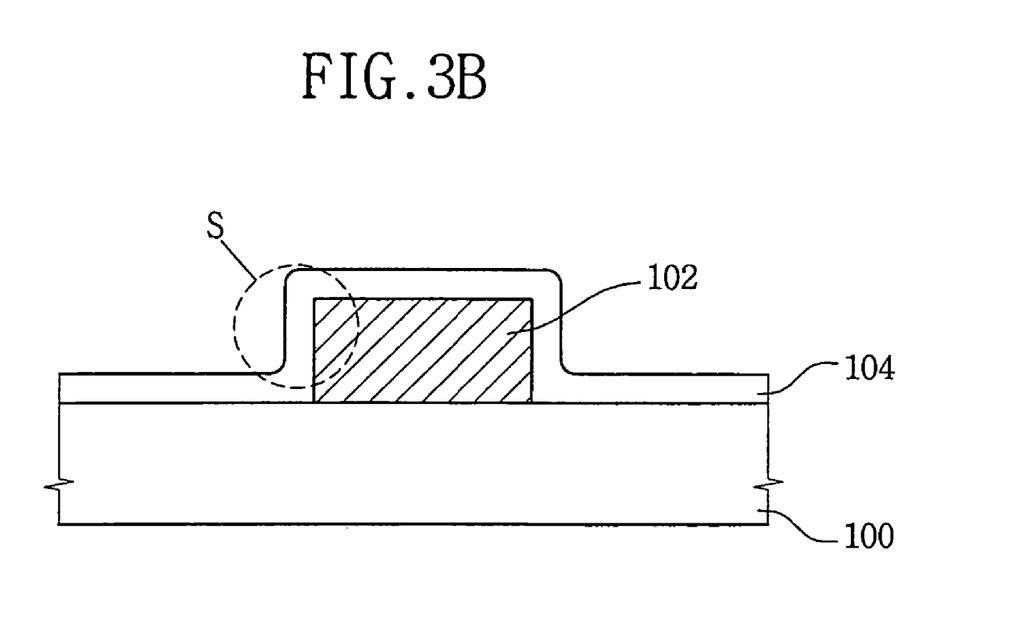

Referring to FIG. 3B, a polishing protection layer 104 is formed on the semiconductor substrate 100 including over the conductive layer 102. The polishing protection layer 104 includes a nitride that facilitates a global planarization of structures formed on the substrate 100 during a subsequent polishing process. More specifically, the polishing protection layer 104 may comprise a layer of silicon nitride, aluminum nitride or boron nitride. Alternatively, the polishing protection layer 104 may comprise an oxide layer such as a layer of aluminum oxide. Furthermore, the polishing protection layer 104 may alternatively comprise a layer of carbon such as diamond phase carbon.

As one particular example, the polishing protection layer 104 comprises a silicon nitride layer formed by a plasma enhanced chemical vapor deposition (PECVD) process using $N_2$, $SiH_4$, and $N_2O$ as source gases.

The polishing protection layer 104 has a step S caused by height difference between the conductive layer 102 and the substrate 100. That is, the portion of the polishing protection layer 104 formed directly on the substrate 100 has a height lower than that of the portion of the polishing protection layer 104 formed on the conductive layer 102.

If a CMP process were to be performed directly on the polishing protection layer 104 having the step S, the CMP process would polish the structure non-uniformly because the polishing head of the CMP device used to carry out the process would contact the polishing protection layer 104 irregularly and thus, exert a non-uniform pressure thereon. In addition, an upper portion of the conductive layer 102 would be polished non-uniformly about the step S of the polishing protection layer 104. An irregularly polished conductive layer would result in a conductive pattern whose upper surface is not level.

Figure 3C:
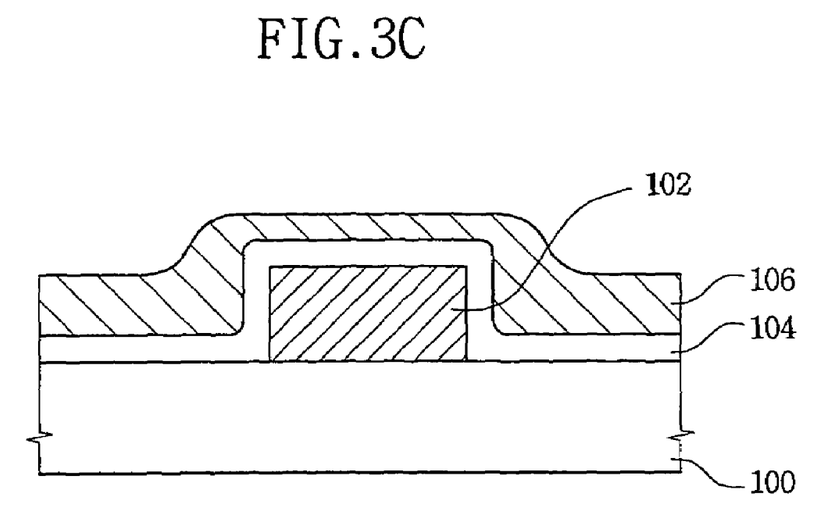

Referring to FIG. 3C, a step compensation layer 106 is formed on the polishing protection layer 104 to compensate for the step S of the polishing protection layer 104. Specifically, the step compensation layer 106 is formed by a CVD process or a spin coating process using a reflowable material. As a result, the portion of the step compensation layer 106 located over the conductive layer 102 is relatively thin compared to the other portions of the step compensation layer 106. Thus, the step present at the surface of the structure to be polished is greatly reduced.

The reflowable material of the step compensation layer 106 may be flowable oxide (FOX), boro-phosphor silicate glass (BPSG), spin on glass (SOG), photoresist, undoped silicate Glass (USG), phosphor silicate glass (PSG), boro silicate glass (BSG) or tetra ethyl ortho silicate (TEOS). Of these materials, the FOX, SOG or photoresist is preferably used because FOX, SOG or photoresist possess a superior flowability.

Figure 3D:
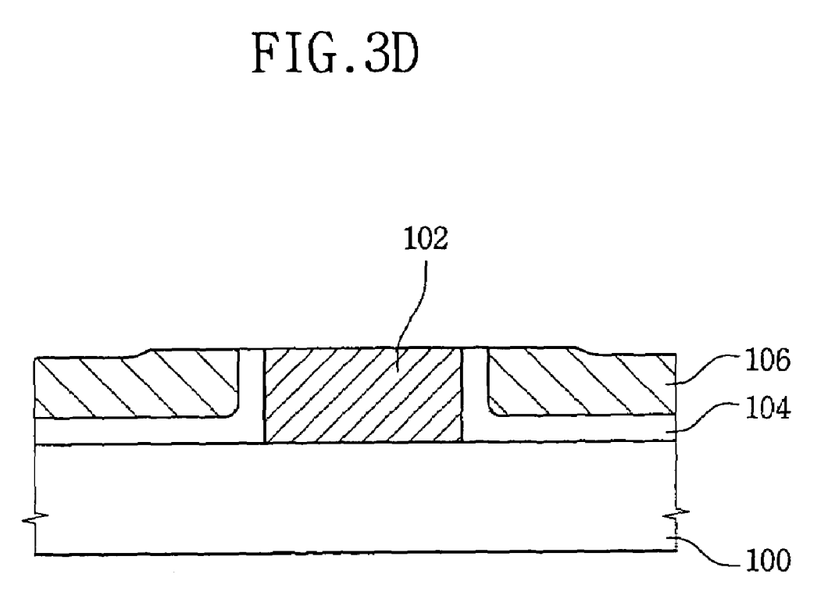

Referring to FIG. 3D, portions of the step compensation layer 106 and the polishing protection layer 104 are removed by a first planarization process to expose the conductive layer 102. After the first planarization process, the exposed conductive layer 102 remains at a center of the remaining portions of the step compensation layer 106 and the polishing protection layer 104 with as a center. The first planarization process is performed by an etch-back process and, more specifically, by a dry etching process. This etch-back process is carried out using a plasma that includes a fluorine-containing gas such as $SF_6$, $CF_4$, $CHF_3$ or mixture of that fluorine-containing gas and $Cl_2$.

Figure 3E:
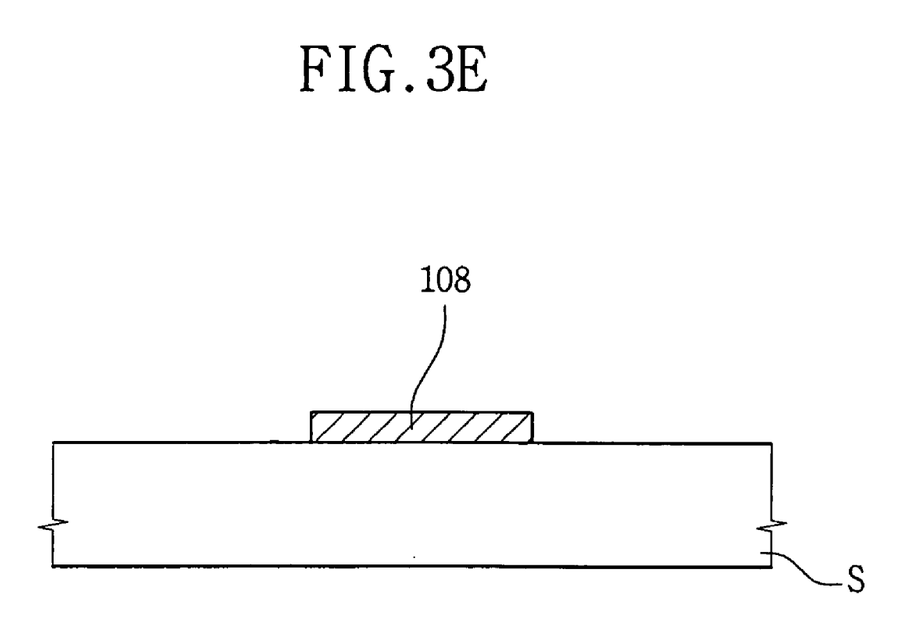

Referring to FIG. 3E, the remaining portions of the step compensation layer 106 and polishing protection layer 104, and an upper portion of the conductive layer 102 are removed by a second planarization process to form a conductive pattern 108 on the semiconductor substrate 100. The second planarization process is a CMP process. This CMP process is carried out using polishing particles such as $SiO_2$ or $Al_2O_3$, an etching agent including acid, and slurry including a surface passivation agent. In the CMP process, the surface passivation agent stabilizes a surface of the conductive layer 102 by growing a surface-stabilizing film thereon, and the polishing particles mechanically remove the material of the surface-stabilizing film, the step compensation layer 106, the polishing protection layer 104, and the conductive layer 102. In addition, the etching agent etches the step compensation layer 106, the polishing protection layer 104, and the upper portion of the conductive layer 102.

Residue of the polishing protection layer 104 remaining around the conductive pattern 108 is removed using an etching solution including phosphoric acid to complete the formation of the conductive pattern 108 on the semiconductor substrate 100.

According to this embodiment, the polishing protection layer 104 formed on the conductive layer 102 is primarily removed by the first planarization process so that the remaining portion of the polishing protection layer 104 has a height substantially identical to that of the conductive layer 102. Then, the remaining portion of the polishing protection layer 104 and the upper portion of the conductive layer 102 are removed by the second planarization process, thereby forming the conductive pattern 108 having a uniform (level) upper overall process surface. As a result, a semiconductor device including the conductive pattern 108 has excellent characteristics and reliability.

In addition, the overall process time for forming the conductive pattern 108 having a level upper surface is relatively short because CMP is used only as a secondary planarization process, i.e., once the polishing protection layer 104 has already been planarized.

Figure 4:
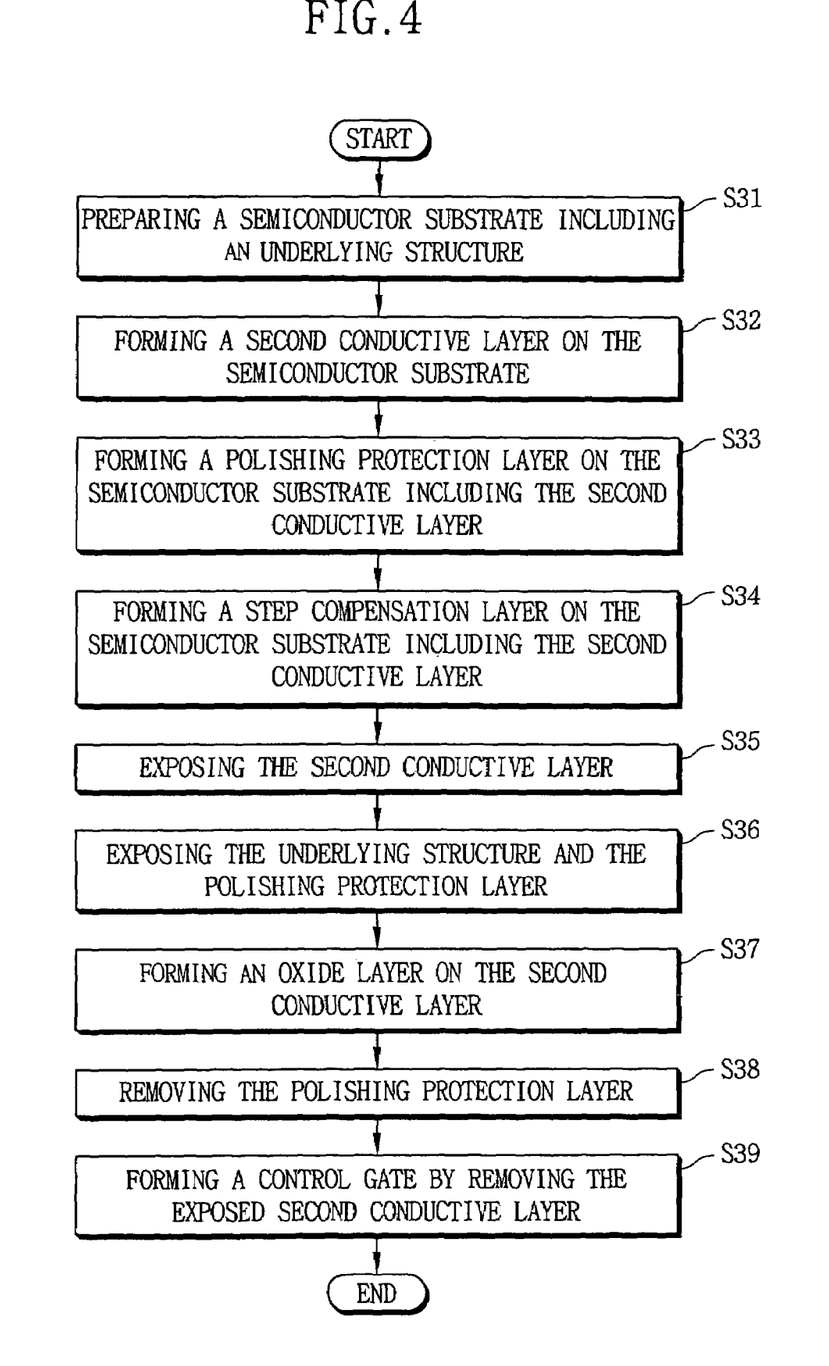
FIG. 4 is a flowchart illustrating a method of manufacturing a non-volatile semiconductor memory device according to the present invention.

FIG. 4 is a flowchart of a method of manufacturing a non-volatile semiconductor memory device according to the present invention.

Referring to FIG. 4, first, an underlying structure is formed on a semiconductor substrate (step S31). For example, the underlying structure may be an insulation layer pattern, a first conductive pattern serving as a floating gate, a spacer, a source line, etc.

Next, a second conductive layer is formed on the semiconductor substrate (step S32).

A polishing protection layer and a step compensation layer are sequentially formed on the second conductive layer (steps S33 and S34). As described above, the polishing protection layer has a step of a predetermined height generated produced as a result of the underlying structure. That is, the portion of the polishing protection layer formed directly on the substrate has height lower than that of the portion of the polishing protection layer formed over the underlying structure. The step presented by the polishing protection layer is reduced by the forming of the step compensation layer on the polishing protection layer.

The second conductive layer is exposed by partially removing the step compensation layer and the polishing protection layer using a first planarization process such as etch-back process (step S35). A second planarization process, such as a CMP process, is carried out (step 36) to remove the exposed second conductive layer, the step compensation layer, and an upper portion of the polishing protection layer and thereby expose the underlying structure, e.g., source line, and the polishing protection layer.

Next, the exposed second conductive layer and the source line are oxidized to form oxide layers thereon (step S37). Then, the applying portion of the polishing protection layer remaining on the second conductive layer is removed to expose the second conductive layer (step S38). Finally, a control gate is formed by removing part of the exposed second conductive layer (step S39).

Next, a method of manufacturing the non-volatile semiconductor memory will be described in detail with reference to FIGS. 5A to 5I. In particular, FIGS. 5A to 5I embodiment describing illustrate a method of manufacturing a split gate type of flash semiconductor memory device using a self-aligning process according to the present invention.

Figure 5A:
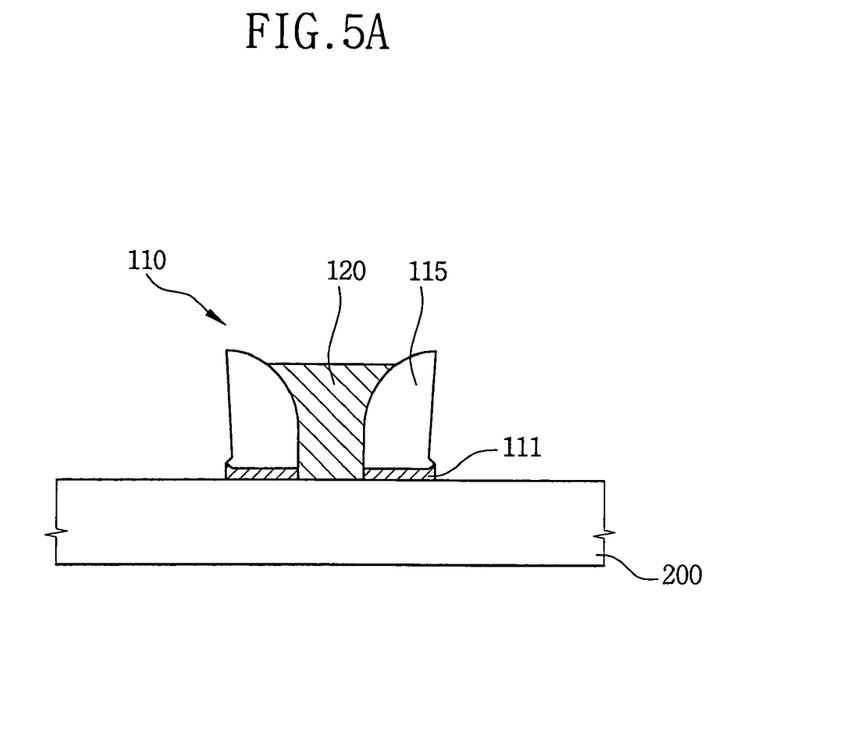
FIGS. 5A to 5I are cross-sectional views of a substrate illustrating the method of manufacturing the non-volatile semiconductor memory device according to the present invention.

Referring to FIG. 5A, a cell array region and a peripheral region are defined on a semiconductor substrate 200 using an isolation process. A first oxide layer (not shown) is formed on the semiconductor substrate 200 using a thermal oxidation process, such as an LOCOS process or a CVD process. A first conductive layer is formed on the first oxide layer. The first conductive layer will be patterned to form a floating gate of the flash semiconductor memory device. In this case, the first conductive layer is formed of polysilicon or doped polysilicon using an LPCVD process.

After a first nitride layer is formed on the first conductive layer, the first nitride layer is etched using a photolithographic process to expose the first conductive layer.

A second oxide layer is formed on the exposed first conductive layer and the first nitride layer, and then the second oxide layer is patterned to form a spacer 115 on a sidewall of the first nitride layer.

Then, a portion of the semiconductor substrate 200 is exposed by etching the first conductive layer and the first oxide layer using the spacer 115 as an etching mask. Subsequently, a source region (not shown) is formed by implanting impurities into the exposed portion of the semiconductor substrate 200 using an ion implantation process.

A source line 120 is then formed on the semiconductor substrate 200 in contact with the source region. Subsequently, the first nitride layer is removed using an etching solution including phosphoric acid. Thus, the first conductive layer and the first oxide layer are exposed. The source line 120 comprises polysilicon or doped polysilicon.

The exposed first conductive layer and the first oxide layer are removed, using the spacer 115 as an etching mask, to form an underlying structure 110 including an oxide pattern (not shown), the floating gate 111, the spacer 115, and the source line 120 in the cell array region of the semiconductor substrate 200. Although FIG. 5Aa1 shows the underlying structure 110 in the cell array region as consisting of the floating gate 111, a spacer 115, and wiring in the form of the source line 120 of a memory cell, the underlying structure 110 may include additional patterns or wiring.

Figure 5B:
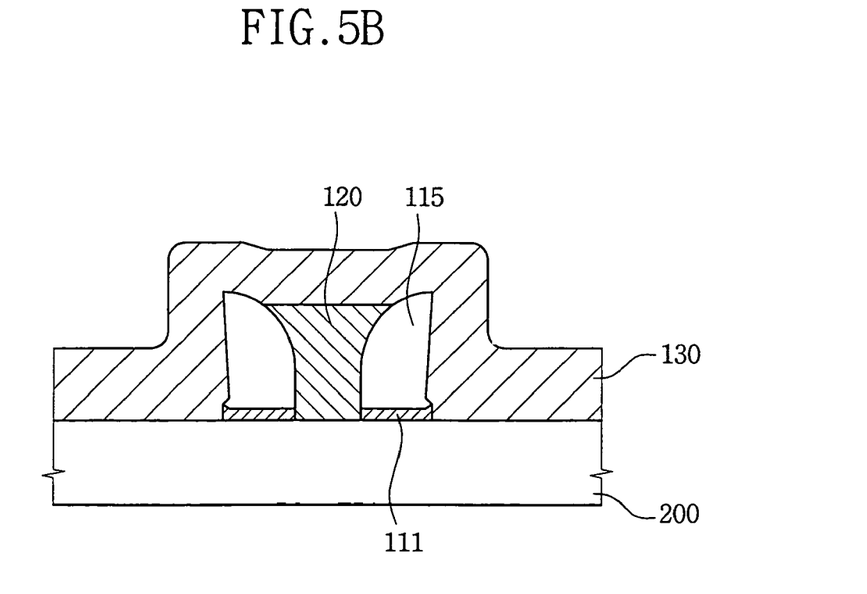

Referring to FIG. 5B, a second conductive layer 130 is formed on the semiconductor substrate 200, including over the underlying structure 110. The second conductive layer 130 will be patterned to form a control gate. Note, an insulation layer (not shown) of an oxide, a nitride or a composite thereof may be formed on the underlying structure 110 before the second conductive layer 130 is formed, to electrically insulate the floating gate 111 from the second conductive layer 130. The second conductive layer 130 is formed of polysilicon or doped polysilicon using a CVD process. In still another embodiment, the second conductive layer 130 is formed of polysilicon or amorphous silicon, and then is doped with impurities using a POCl$_3$ diffusion process, an ion implantation process or an in-situ doping process.

Figure 5C:
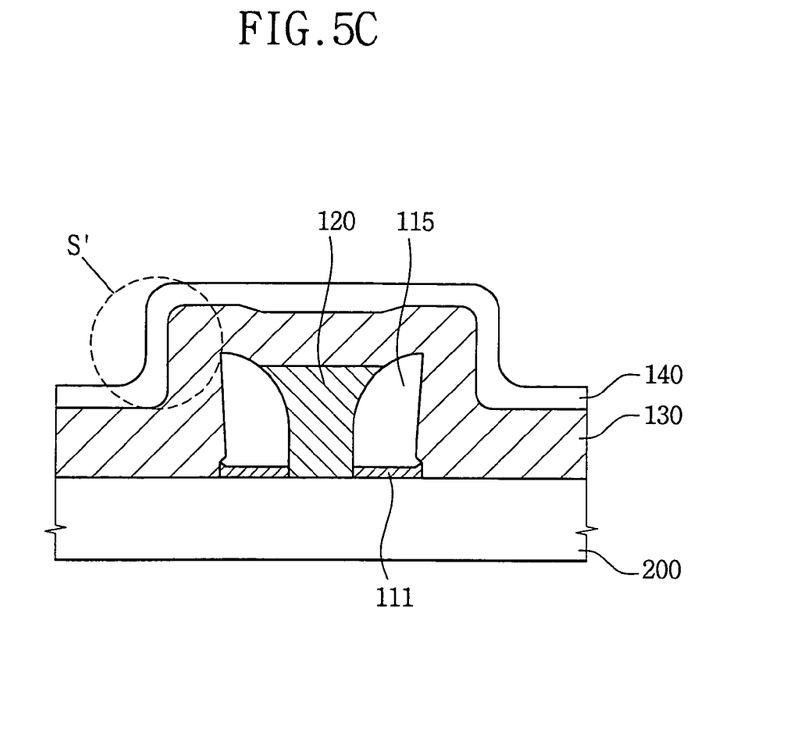

Referring to FIG. 5C, a polishing protection layer 140 of carbon, a nitride or an oxide is formed on the second conductive layer 130. In particular, diamond phase carbon, aluminum oxide, aluminum nitride or boron nitride is used for forming the polishing protection layer 140. Here, the polishing protection layer 140 has a step S' of a predetermined height generated produced as a result of its being formed on the underlying structure 110. That is, a difference generated in height exists between the portion of the polishing protection layer 140 formed over the underlying structure 110 and the portions of the polishing protection layer 140 located over the semiconductor substrate 200 to the side of the underlying structure 110.

Figure 5D:
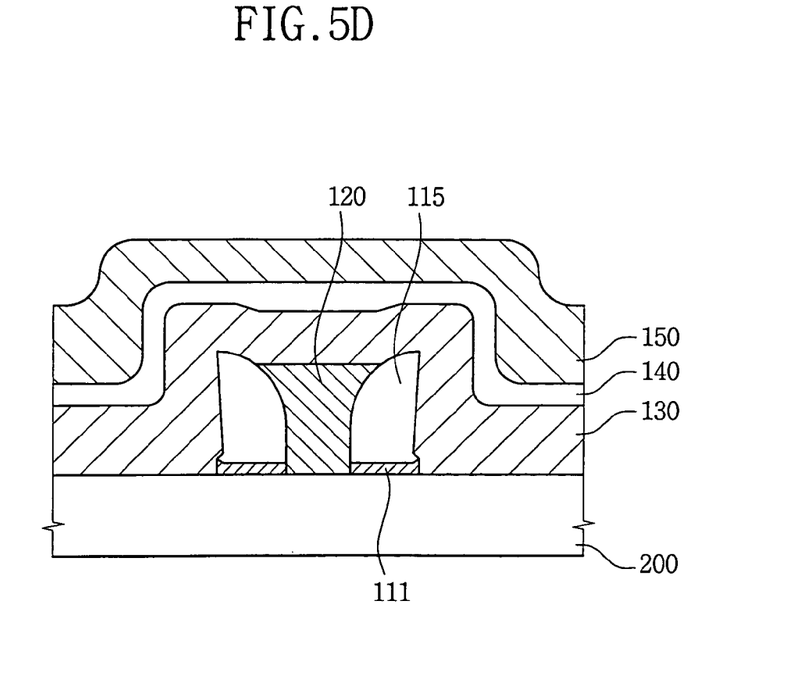

Referring to FIG. 5D, a step compensation layer 150 is formed on the polishing protection layer 140 by a CVD process or a spin coating method using reflowable material to reduce the step S' presented by the polishing protection layer 140. To this end, the portion of the step compensation layer 150 formed over the underlying structure 110 is thinner than the portions of the step compensation layer 150 formed on the polishing protection layer 140. Examples of the reflowable material used to form the step compensation layer 150 include FOX, BPSG, SOG, photoresist, PSG, BSG or TEOS.

Figure 5E:
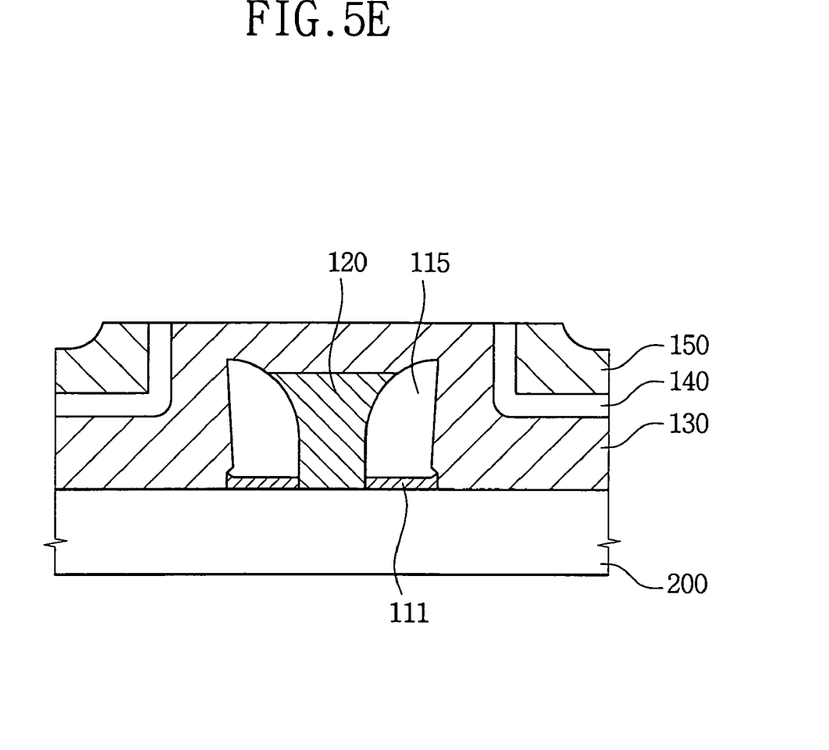

Referring to FIG. 5E, a portion of the second conductive layer 130 is exposed by removing parts of the step compensation layer 150 and the polishing protection layer 140 using a first planarization process. The first planarization process is an etch-back process. This etch-back process is performed using a plasma of a fluorine-containing gas such as $SF_6$, $CF_4$, and $CHF_3$ or of a mixture of such a fluorine-containing gas and $Cl_2$.

Figure 5F:
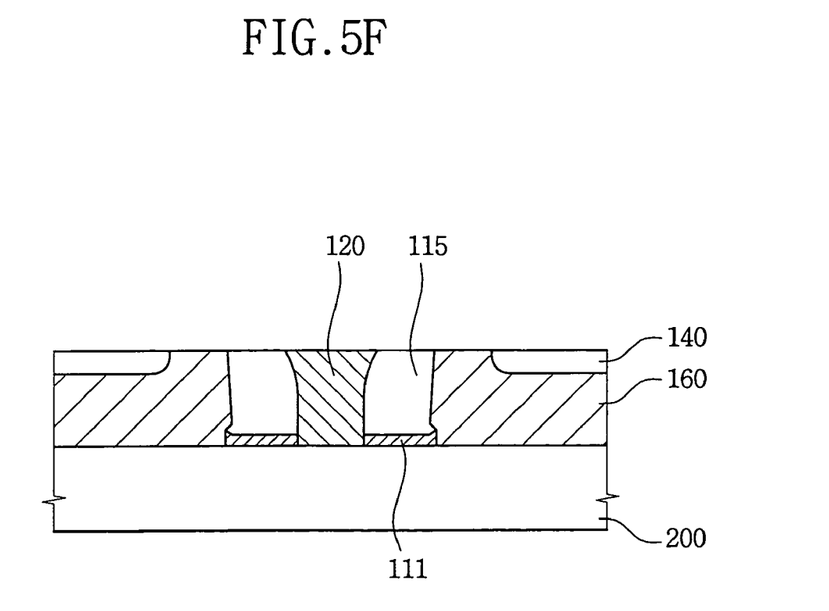

Referring to FIG. 5F, the second conductive pattern 160 is formed adjacent the floating gate 110 by removing the remainder of the step compensation layer 150 and by removing portions of the second conductive layer 130, the polishing protection layer 140 and the spacer 115, until the source line 120 is exposed. The second conductive pattern 160 is exposed between the remaining portions of the polishing protection layer 140 and the spacer 115. The second planarization process is a CMP process. The CMP process is carried out using polishing particles such as $SiO_2$ or $Al_2O_3$, an etching agent including acid, and slurry including a surface passivation agent as described above.

Figure 5G:
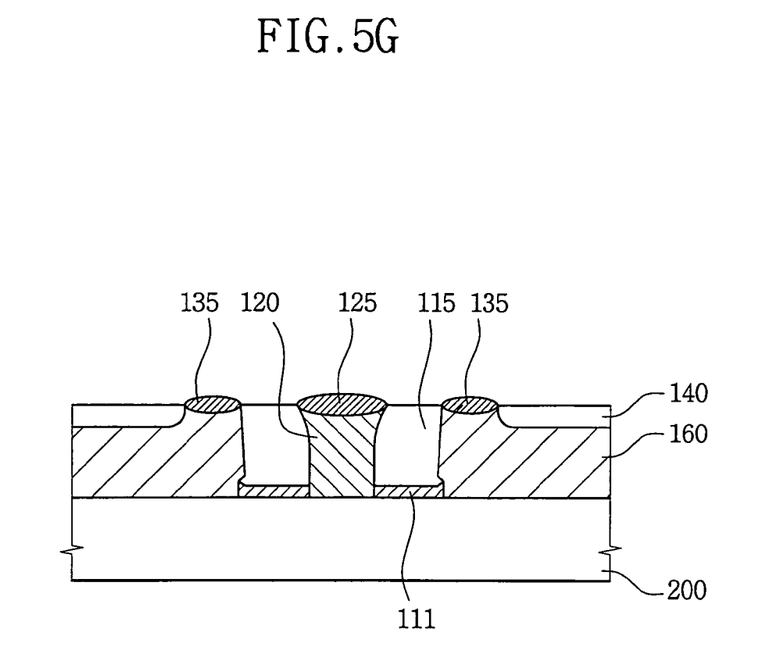

Referring to FIG. 5G, third oxide layers 125 and 135 are formed on the second conductive pattern 160 and the source line 120 by oxidizing upper portions of the exposed second conductive layer 130 and the source line 120, respectively. The third oxide layers 125 and 135 are formed by a thermal oxidation process. The third oxide layers 125 and 135 serve as etching masks during the subsequent etching of the second conductive pattern 160 (described below).

Figure 5H:
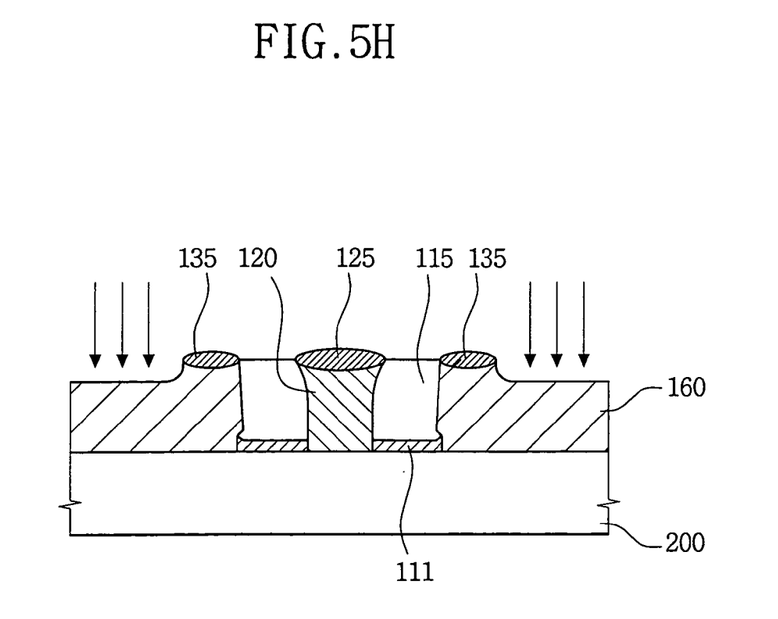

Referring to FIG. 5H, the polishing protection layer 140 remaining on the second conductive pattern 160 is removed using an etching solution including phosphoric acid. Thus, portions of the second conductive layer 130 are exposed. For example, when the etching solution contains phosphoric acid ($H_3PO_4$) and the polishing protection layer 140 is of silicon nitride, the polishing protection layer 140 is completely removed.

Figure 5I:
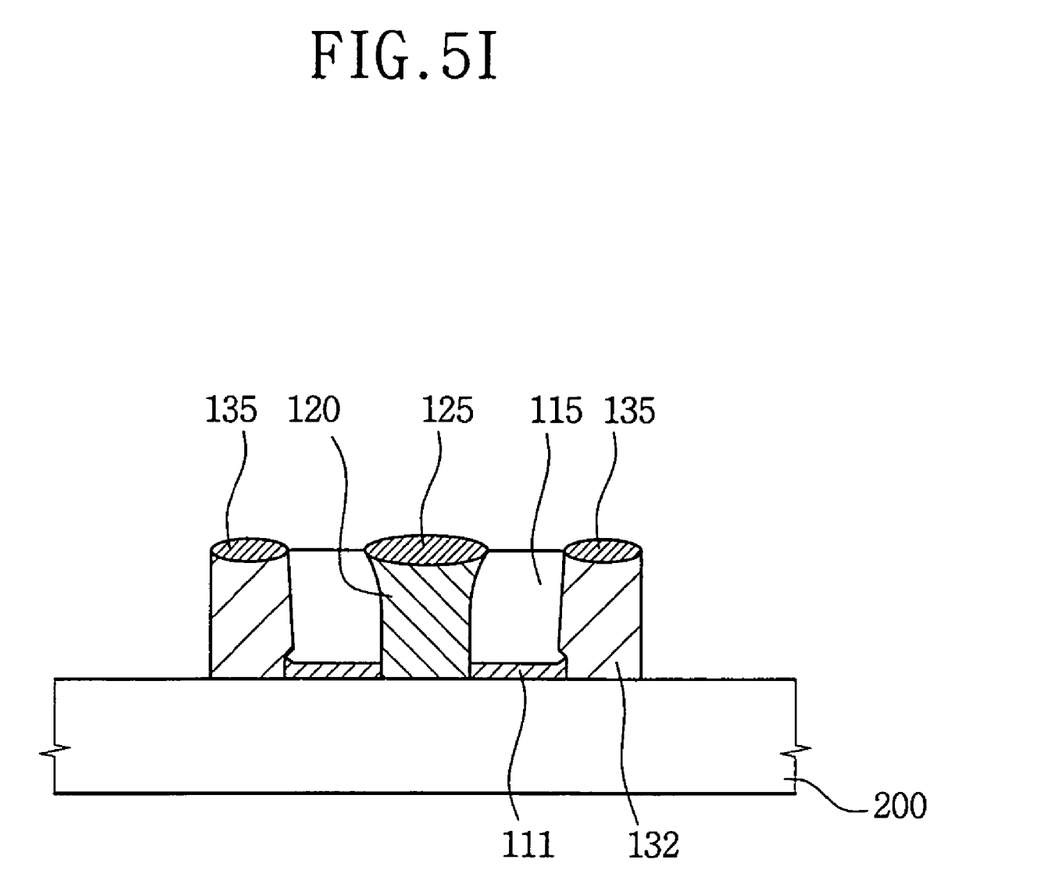

Referring to FIG. 5I, a control gate 132 is formed adjacent the floating gate 111 by etching the exposed conductive pattern 160 using the third oxide layer 135 as an etching mask. This etching process is an anisotropic etching process such as a dry etching process, e.g., a plasma etching process or a reactive ion etching (RIE) process. At this time, nearly all of the third oxide layer 135 is removed while later, it. The remainder of the third oxide layer 135 is removed during a subsequent cleaning process or a silicidation pretreatment process.

Next, a nitride spacer (not shown) is formed on the semiconductor substrate 200 adjacent the control gate 132. Then, a drain region (not shown) is formed in the semiconductor substrate 200. Finally, a metal wiring and a drain contact are formed adjacent the control gate 132 to complete the flash semiconductor memory device.

According to this present invention as described above, the use of two planarization processes and the step compensation layer form a conductive pattern, e.g., a control gate, having a high degree of uniformity. Thus, the resultant semiconductor device possesses excellent characteristics and a high degree of reliability. In addition, the overall time of the semiconductor device manufacturing process is relatively short because the CMP process is performed on layers that have already been partially planarized, namely the polishing protection layer and conductive layer. Furthermore, the present invention offers a method of manufacturing a split gate type of flash semiconductor memory device using a self-aligning process as opposed to a photolithographic process. Hence, the elements of the semiconductor device can be stably formed.

Although the invention has been described above with respect to the several times in the presence of overall for preferred embodiments thereof, it is understood that the invention is not so limited. Rather, various changes and modifications can be made to the preferred embodiments within the true spirit and scope of the invention as hereinafter claimed.

What is claimed is:

1. A method of forming a conductive pattern of a semiconductor device, comprising:
    forming a conductive layer on a substrate such that the conductive layer protrudes above an upper surface of the substrate;
    forming a polishing protection layer on the substrate, including over the conductive layer, whereby the polishing protection layer presents a step between a portion of the polishing protection layer lying directly over the substrate and a portion of the polishing layer lying over the conductive layer;
    forming a step compensation layer on the polishing protection layer that reduces the step presented by the polishing protection layer;
    removing portions of the step compensation layer and the polishing protection layer to expose the conductive layer; and
    etching away part of the exposed conductive layer to form a conductive pattern on the substrate.

2. The method of claim 1, wherein said forming of the polishing protection layer comprises forming one of a carbon, oxide and nitride layer on the substrate, including over the conductive layer.

3. The method of claim 2, wherein said forming of the polishing protection layer comprises forming one of a silicon nitride, aluminum oxide, diamond phase carbon, aluminum nitride and boron nitride layer on the substrate, including over the conductive layer.

4. The method of claim 1, wherein said forming of the step compensation layer comprises forming a layer of reflowable material on the polishing protection layer.

5. The method of claim 4, wherein the material is selected from the group consisting of flowable oxide, boro-phosphor silicate glass, spin on glass, photoresist, undoped silicate glass, phosphor silicate glass, boro silicate glass and tetra ethyl ortho silicate.

6. The method of claim 4, wherein the step compensation layer is formed by a chemical vapor deposition process or a spin coating process.

7. The method of claim 1, wherein said removing portions of the step compensation layer and the polishing protection layer comprises removing only some of the step compensation layer and the polishing protection layer using a first planarization process.

8. The method of claim 7, wherein the first planarization process is an etch-back process.

9. The method of claim 7, wherein said etching away part of the exposed conductive layer to form a conductive pattern comprises etching the step compensation layer, the polishing protection layer and the conductive layer using a second planarization process.

10. The method of claim 9, wherein the second planarization process is a chemical mechanical polishing process.

11. The method of claim 9, further comprising subsequently removing a remaining portion of the polishing protection layer from around the conductive pattern.

12. The method of claim 11, wherein said remaining portion of the polishing protection layer is removed using an etching solution including phosphoric acid.

13. A method of manufacturing a non-volatile semiconductor memory device comprising:
    forming a structure including a floating gate on a substrate;
    forming a conductive layer on the substrate including over the structure;
    forming a polishing protection layer on the conductive layer, whereby the polishing protection layer presents a step between a portion of the polishing protection layer lying directly over the substrate and a portion of the polishing layer lying over the conductive layer;
    forming a step compensation layer on the polishing protection layer that reduces the step presented by the polishing protection layer;
    removing portions of the step compensation layer and the polishing protection layer to expose the conductive layer; and
    etching away part of the exposed conductive layer to form a conductive pattern on the substrate;
    forming an oxide layer on the conductive pattern; and
    etching the conductive pattern using the oxide layer as an etching mask to form a control gate adjacent the floating gate.

14. The method of claim 13, wherein said removing portions of the step compensation layer and the polishing protection layer comprises removing only some of the step compensation layer and the polishing protection layer using a first planarization process.

15. The method of claim 14, wherein the first planarization process is an etch-back process.

16. The method of claim 13, wherein said etching away part of the exposed conductive layer to form a conductive pattern comprises etching the step compensation layer, the polishing protection layer and the conductive layer using a second planarization process.

17. The method of claim 16, wherein the second planarization process is a chemical mechanical polishing process.

18. The method of claim 13, wherein said forming the oxide layer comprises oxidizing the conductive pattern.

19. The method of claim 13, further comprising removing a residual portion of the polishing protection layer from around the conductive pattern after the control gate is formed.

20. The method of claim 19, wherein the residual portion of the polishing protection layer is removed using an etching solution including phosphoric acid.

* * * * *